(12) United States Patent
Bae et al.

(10) Patent No.: US 8,026,749 B2
(45) Date of Patent: Sep. 27, 2011

(54) PHASE LOCKED LOOP CIRCUIT, METHOD OF OPERATING PHASE LOCKED LOOP CIRCUIT AND SEMICONDUCTOR MEMORY DEVICE INCLUDING PHASE LOCKED LOOP CIRCUIT

(75) Inventors: Seungjun Bae, Hwaseong-si (KR); Young-Sik Kim, Gunpo-si (KR); Sanghyup Kwak, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/591,399

(22) Filed: Nov. 18, 2009

(65) Prior Publication Data

US 2010/0123498 A1    May 20, 2010

(30) Foreign Application Priority Data

Nov. 19, 2008 (KR) .................. 10-2008-0115197

(51) Int. Cl.
    *H03L 7/06* (2006.01)
(52) U.S. Cl. .................. 327/158; 327/149
(58) Field of Classification Search .............. 327/149, 327/158
    See application file for complete search history.

(56) References Cited

U.S. PATENT DOCUMENTS

| | | | |
|---|---|---|---|
| 7,298,189 B2 * | 11/2007 | Kang et al. | 327/158 |
| RE40,205 E * | 4/2008 | Funaba et al. | 365/194 |
| 7,724,050 B2 * | 5/2010 | Lee | 327/158 |
| 7,760,839 B2 * | 7/2010 | Wu | 375/376 |
| 2006/0152260 A1 * | 7/2006 | Chung | 327/158 |
| 2008/0042704 A1 * | 2/2008 | Na | 327/158 |
| 2008/0094115 A1 * | 4/2008 | Ishikawa | 327/158 |
| 2008/0169852 A1 * | 7/2008 | Kim et al. | 327/158 |
| 2010/0097111 A1 * | 4/2010 | Hyun et al. | 327/158 |
| 2010/0213991 A1 * | 8/2010 | Fukuda | 327/117 |

FOREIGN PATENT DOCUMENTS

| | | |
|---|---|---|
| KR | 10-2003-0016553 A | 3/2003 |
| KR | 10-2006-0093542 A | 8/2006 |
| KR | 10-2008-0022451 A | 3/2008 |

\* cited by examiner

*Primary Examiner* — Lincoln Donovan
*Assistant Examiner* — Adam Houston
(74) *Attorney, Agent, or Firm* — Lee & Morse, P.C.

(57) ABSTRACT

A phase locked loop circuit includes a delay compensation circuit and a phase change circuit. The delay compensation circuit is adapted to generate a delay clock signal by delaying a phase of a first output clock signal by a second phase, the phase of the first output clock signal having a phase leading a phase of an input clock signal by a first phase, and the second phase corresponding to a delay compensation time greater than a period of the input clock signal and greater than the first phase. The phase change circuit is adapted to change the second phase to the first phase and to generate a feedback clock signal having a phase synchronized with the phase of the input clock signal in response to the first phase, wherein the first phase is a phase corresponding to a remainder time resulting from the delay compensation time being divided by the period of the input clock, and wherein the quotient is an integer.

10 Claims, 7 Drawing Sheets

PHASE LOCKED LOOP CIRCUIT, METHOD OF OPERATING PHASE LOCKED LOOP CIRCUIT AND SEMICONDUCTOR MEMORY DEVICE INCLUDING PHASE LOCKED LOOP CIRCUIT

BACKGROUND

1. Field

Exemplary embodiments relate to electronic circuits, and more particularly, to a phase locked loop circuit, a semiconductor memory device including a phase locked loop circuit, and a method of operating a phase locked loop circuit.

2. Description of the Related Art

A phase locked loop circuit compares a phase of an input clock signal with a phase of a feedback clock signal, and controls the two signals so that phases of the two signals are synchronized with each other. A phase locked loop circuit may be used in a semiconductor integration circuit such as a semiconductor memory device.

A phase locked loop circuit may include a phase detector, a charge pump circuit, a loop filter embodied by a low pass filter, and a voltage controlled oscillator.

The phase detector detects a phase difference between an input clock signal and a feedback clock signal output from the voltage controlled oscillator. The charge pump circuit charges electric charges in the loop filter or discharges the electric charges charged in the loop filter in response to an output signal of the phase detector. The voltage controlled oscillator outputs a feedback clock signal synchronized with an input clock signal in response to a voltage corresponding to electric charges charged or discharged in the loop filter.

SUMMARY

Embodiments are therefore directed to a phase locked loop circuit, a semiconductor memory device including a phase locked loop circuit, and a method of operating a phase locked loop circuit, which substantially overcome one or more of the problems due to the limitations and disadvantages of the related art.

It is therefore a feature of an embodiment to provide a phase locked loop circuit having a reduced feedback delay time as compared to conventional phase locked loop circuits.

It is therefore a separate feature of an embodiment to provide a phase locked loop circuit having a reduced size as compared to conventional phase locked loop circuits.

It is therefore a separate feature of an embodiment to provide a phase locked loop circuit having increased bandwidth as compared to conventional phase locked loop circuits.

It is therefore a separate feature of an embodiment to provide a phase locked loop circuit having reduced output jitter as compared to conventional phase locked loop circuits.

It is therefore a separate feature of an embodiment to provide a phase locked loop circuit having increase stability as compared to conventional phase locked loop circuits.

At least one of the above and other features and advantages may be realized by providing a phase locked loop circuit, including a delay compensation circuit adapted to generate a delay clock signal by delaying a phase of a first output clock signal by a second phase, the phase of the first output clock signal having a phase leading a phase of an input clock signal by a first phase, and the second phase corresponding to a delay compensation time greater than a period of the input clock signal and greater than the first phase, and a phase change circuit adapted to change the second phase to the first phase and to generate a feedback clock signal having a phase synchronized with the phase of the input clock signal in response to the first phase, wherein the first phase is a phase corresponding to a remainder time resulting from the delay compensation time being divided by the period of the input clock, the quotient being an integer.

The phase change circuit may include a phase detector adapted to detect a phase difference between the delay clock signal and the feedback clock signal and to generate a difference signal corresponding to the first phase, and a variable delay circuit adapted to delay the first output clock signal by the first phase in response to the difference signal to generate a feedback clock signal having a phase synchronized with the phase of the input clock signal.

The phase locked loop circuit may include a charge pump circuit and a low pass filter disposed between the phase detector and the variable delay circuit.

The phase locked loop circuit may include a voltage controlled oscillator adapted to generate multiphase output clock signals including the first output clock signal, wherein the phase change circuit may generate a feedback clock signal having a phase synchronized with the phase of the input clock signal in response to the multiphase output clock signals corresponding to the first phase, and the multiphase output clock signals may include a second output clock signal having a phase of 360×1/N degrees through Nth output clock signal having 360×(N−1)/N degrees by delaying the first output clock signal and a phase of the first output clock signal by 360/N degrees, respectively, where N is a natural number of 2 or more When the N is 4, the voltage controlled oscillator may generate the first output clock signal, a second output clock signal having a phase lagging behind the phase of the first output clock signal by 90 degrees, a third output clock signal having a phase lagging behind the phase of the first output clock signal by 180 degrees and a fourth output clock signal having a phase lagging behind the phase of the first output clock signal by 270 degrees.

The phase change circuit may include a phase detector adapted to generate a difference signal corresponding to the first phase by detecting a phase difference between the delay clock signal and the feedback clock signal, a control signal generation circuit adapted to generate a digital control signal in response to the difference control signal, a first select circuit adapted to select one among the first through fourth output clock signals in response to the digital control signal, a second select circuit adapted to select another one among the first through fourth output clock signals in response to the digital control signal, the another one having a phase greater than and adjacent to a phase of the output clock signal selected by the first select circuit, a first phase interpolator adapted to control a phase of the output clock signal selected by the first select circuit, and output the output clock signal in response to the digital control signal, and a second phase interpolator adapted to control a phase of the output clock signal selected by the second select circuit, and output the output clock signal in response to the digital control signal, wherein the output signal of the first phase interpolator may be added to the output signal of the second phase interpolator to generate the feedback clock signal.

A circuit including the first and second select circuits and the first and second phase interpolators may be a phase rotator.

The first phase may be relatively small as compared to the second phase.

The delay compensation time may correspond to a data output time of a semiconductor memory device.

The semiconductor memory device may be a double data rate (DDR) synchronous dynamic random access memory (SDRAM) and/or a graphic double rate (GDDR) SDRAM.

The phase change circuit may be adapted to compensate for a change in the delay compensation time of the delay compensation circuit as a result of temperature.

At least one of the above and other features and advantages may be separately realized by providing a method of operating a phase locked loop circuit, including generating a first output clock signal having a phase leading a phase of an input clock signal by a first phase, generating a delay clock signal by delaying the phase of the first output clock signal by a second phase corresponding to a delay compensation time greater than a period of the input clock signal and greater than the first phase, and changing the second phase to the first phase, and then generating a feedback clock signal having a phase synchronized with the phase of the input clock signal using the first phase, wherein the first phase is a phase corresponding to a remainder time resulting from the delay compensation time being divided by the period of the input clock, the quotient being an integer.

Changing the second phase to the first phase, may include detecting a phase difference between the delay clock signal and the feedback clock signal to generate a difference signal corresponding to the first phase, and delaying the first output clock signal by the first phase in response to the difference signal to generate a feedback clock signal having a phase synchronized with the phase of the input clock signal.

Generating the first output clock signal may include generating a second output clock signal having a phase of 360× 1/N degrees through Nth output clock signal having a phase of 360×(N−1)/N degrees by delaying a phase of the first output clock signal by 360/N degrees, respectively, where N is natural number of 2 or more, and changing the second phase to the first phase may include generating a feedback clock signal having a phase synchronized with the phase of the input clock signal using phases of at least two signals among the first through Nth output clock signals corresponding to the first phase.

At least one of the above and other features and advantages may be separately realized by providing a semiconductor memory device, including a phase locked loop circuit adapted to generate a first output clock signal having a phase leading a phase of an input clock signal by a first phase, and a data output buffer adapted to output an internal output data as an output data in response to the first output clock signal, the internal output data being output from a memory cell array included in the semiconductor memory device, wherein the phase locked loop circuit, may include a delay compensation circuit adapted to generate a delay clock signal by the phase of the first output clock signal by a second phase corresponding to a delay compensation time greater than a period of the input clock signal and being greater than the first phase, and a phase change circuit adapted to change the second phase to the first phase, and to generate a feedback clock signal having a phase synchronized with a phase of the input clock signal in response to the first phase, wherein the first phase is a phase corresponding to a remainder time resulting from the delay compensation time being divided by the period of the input clock, the quotient being an integer.

The phase change circuit may include a phase detector adapted to generate a difference signal corresponding to the first phase by detecting a phase difference between the delay clock signal and the feedback clock signal, and a variable delay circuit adapted to delay the first output clock signal by the first phase in response to the difference signal, and to generate a feedback clock signal having a phase synchronized with the phase of the input clock signal.

The semiconductor memory device may be a double data rate (DDR) synchronous dynamic random access memory (SDRAM) and/or a graphic double rate (GDDR) SDRAM.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2008-0115197, filed on Nov. 19, 2008, in the Korean Intellectual Property Office, and entitled: "Phase Locked Loop Circuit, Method of Operating Phase Locked Loop Circuit and Semiconductor Memory Device Including Phase Locked Loop Circuit," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
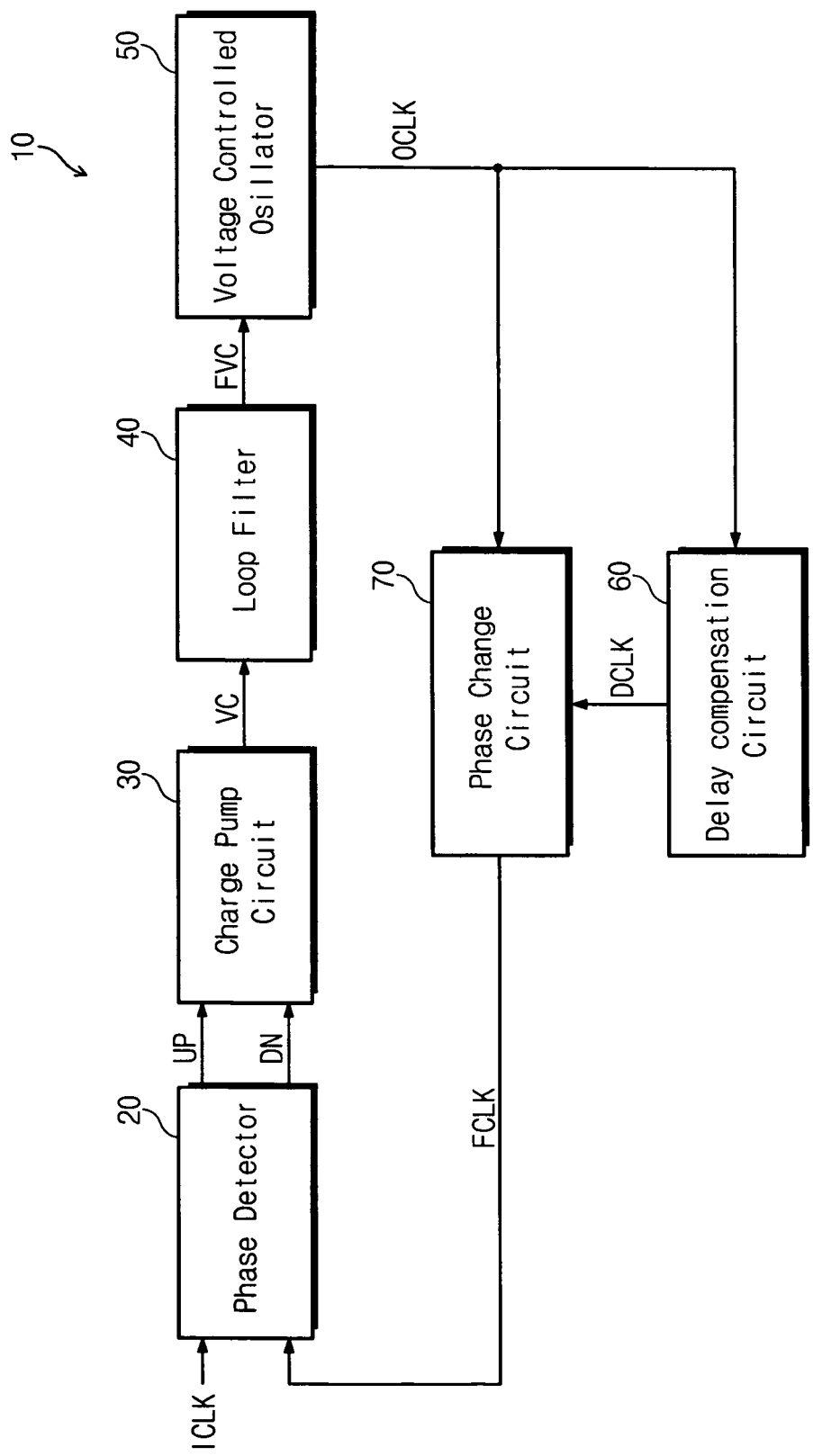
FIG. 1 illustrates a block diagram of a phase locked loop circuit according to an exemplary embodiment.

FIG. 1 illustrates a block diagram of a phase locked loop circuit 10 according to an exemplary embodiment. Referring to FIG. 1, the phase locked loop circuit 10 may include a phase detector 20, a charge pump circuit 30, a loop filter 40, a voltage controlled oscillator 50, a delay compensation circuit 60, and a phase change circuit 70. The phase locked loop circuit 10 may generate a feedback clock signal (FCLK) having a phase synchronized with a phase of an input clock signal (ICLK).

The phase detector 20 may detect a phase difference between an input clock signal (ICLK) and a feedback clock signal (FCLK). The phase detector 20 may output an up signal (UP) and/or a down signal (DN). The up signal (UP) may be generated when a phase of an input clock signal (ICLK) leads a phase of a feedback clock signal (FCLK) and the down signal (DN) may be generated when a phase of an input clock signal (ICLK) lags behind a phase of a feedback clock signal (FCLK). The phase detector 20 may be embodied by an exclusive OR gate (XOR), a flip-flop, etc.

The charge pump circuit 30 may increase a voltage level of a control signal (VC) in response to the up signal (UP). The charge pump circuit 30 may decrease a voltage level of the control signal (VC) in response to the down signal (DN).

The loop filter 40 may filter high frequency components of the control signal (VC) to generate a control signal (FVC), which may be a DC voltage.

The voltage controlled oscillator 50 may control a frequency of an output clock signal (OCLK) in response to the control signal (FVC). The voltage controlled oscillator 50 may be embodied by, e.g., a ring oscillator including an inverter.

The output clock signal (OCLK) may have a phase leading a phase of the input clock signal (ICLK) by a first phase equivalent to a second phase corresponding to a delay compensation time of the delay compensation circuit 60. The first phase may be a phase corresponding to a remainder time resulting from the delay compensation time being divided by a period of the input clock signal (ICLK) (or the feedback clock signal (FCLK)), where the quotient is an integer. The first phase may be relatively small compared with the second phase. The first phase may be a time corresponding to a difference between, e.g., subtraction, a time corresponding to an integer multiple of the period of the input clock signal (ICLK) (or the feedback clock signal (FCLK)) and the delay compensation time. The first phase may correspond to a time smaller than the period of the input clock signal (ICLK) (or the feedback clock signal (FCLK)).

The delay compensation time may be relatively large compared with the period of the input clock signal (ICLK). For example, the delay compensation time may be a data output time (tSAC) of a semiconductor memory device such as a double data rate (DDR) synchronous dynamic random access memory (SDRAM) or a graphic double data rate (GDDR) SDRAM. The data output time (tSAC) may correspond to a period of time that lapses from when an output clock signal (OCLK) is input to a data output buffer included in a semiconductor memory device to when data is output from the data output buffer. In a DDR SDRAM or a GDDR SDRAM, when a period of an input clock signal (ICLK) is, e.g., about 1 ns, the delay compensation time may be a time, e.g., between about 3 ns and about 5 ns.

The delay compensation circuit 60 may generate a delay clock signal (DCLK) by delaying a phase of an output clock signal (OCLK) by the second phase. When the delay compensation circuit 60 is employed with a semiconductor memory device, the delay compensation circuit 60 may be a replica circuit compensating for a delay time (tSAC) in a data output buffer included in the semiconductor memory device.

The phase change circuit 70 may perform a function similar to a delay locked loop circuit, and may perform a function of a delay compensation circuit. Since the phase change circuit 70 may have a small feedback delay time, the phase change circuit 70 may have a relatively great bandwidth that may be employed to compensate for a change of a delay compensation time in the delay compensation circuit 60 according to a temperature in the delay compensation circuit 60.

The phase change circuit 70 may change a delay compensation time having the second phase to a first phase that may correspond to the second phase, e.g., may correspond to a remainder time that may result from dividing the delay compensation time by a period of the input clock signal (ICLK) (or the feedback clock signal (FCLK)), where the quotient is an integer. The first phase may correspond to a phase difference between the delay clock signal (DCLK) and the feedback clock signal (FCLK). The phase change circuit 70 may generate a feedback clock signal (FCLK) having a phase synchronized with a phase of the input clock signal (ICLK) using the first phase.

The phase change circuit 70 can change a second phase, (e.g., 1080 degrees=360 degrees×3), corresponding to the delay compensation time to a first phase equivalent to the second phase. That is, e.g., the first phase may be a phase of less than 360 degrees corresponding to a period of an input clock signal (ICLK).

For example, when a period of an input clock signal (ICLK) is 1 ns and a delay compensation time is about 3.3 ns, a delay time of an output clock signal (OCLK) in the phase change circuit 70 may be about 0.3 ns. That is, the phase change circuit 70 may delay a phase of an output clock signal (OCLK) by a phase corresponding to about 0.3 ns to generate a feedback clock signal (FCLK) having a phase synchronized with a phase of an input clock signal.

Thus, embodiments of a phase locked loop circuit, e.g., the phase locked loop circuit 10, may perform a locking operation and/or synchronize a phase of a signal, e.g., a phase of a feedback clock signal (FCLK), with a phase of an input signal, e.g., a phase of an input clock signal (ICLK), in accordance with a delay compensation time having a second phase based on a first phase that may be smaller than, but equivalent to, the second phase. Embodiments may enable a feedback delay time, e.g., a delay time of the phase change circuit 70, of the phase locked loop circuit 10 to be reduced.

In embodiments, by reducing a feedback delay time of the phase locked loop circuit 10, a bandwidth of the phase locked loop circuit 10 may be increased. By increasing a bandwidth of the phase locked loop circuit 10, e.g., stability of the phase locked loop circuit 10 may be improved, an output jitter of the phase locked loop circuit 10 may be reduced, and/or a size of a capacitor of the loop filter 40 may be reduced. More particularly, in embodiments, by increasing a bandwidth of, e.g., the phase locked loop circuit 10, even though a power supply noise may exist, e.g., in the delay compensation circuit 60 and/or the voltage controlled oscillator 50, an output jitter of the phase locked loop circuit 10 may be reduced. By reducing a size of a capacitor of the loop filter 40 included in the phase locked loop circuit 10, a size of an area of the phase locked loop circuit 10 may be reduced.

Since the phase locked loop circuit 10 has a feedback delay time, the phase locked loop circuit 10 may filter a jitter of an input clock signal (ICLK).

Figure 2:
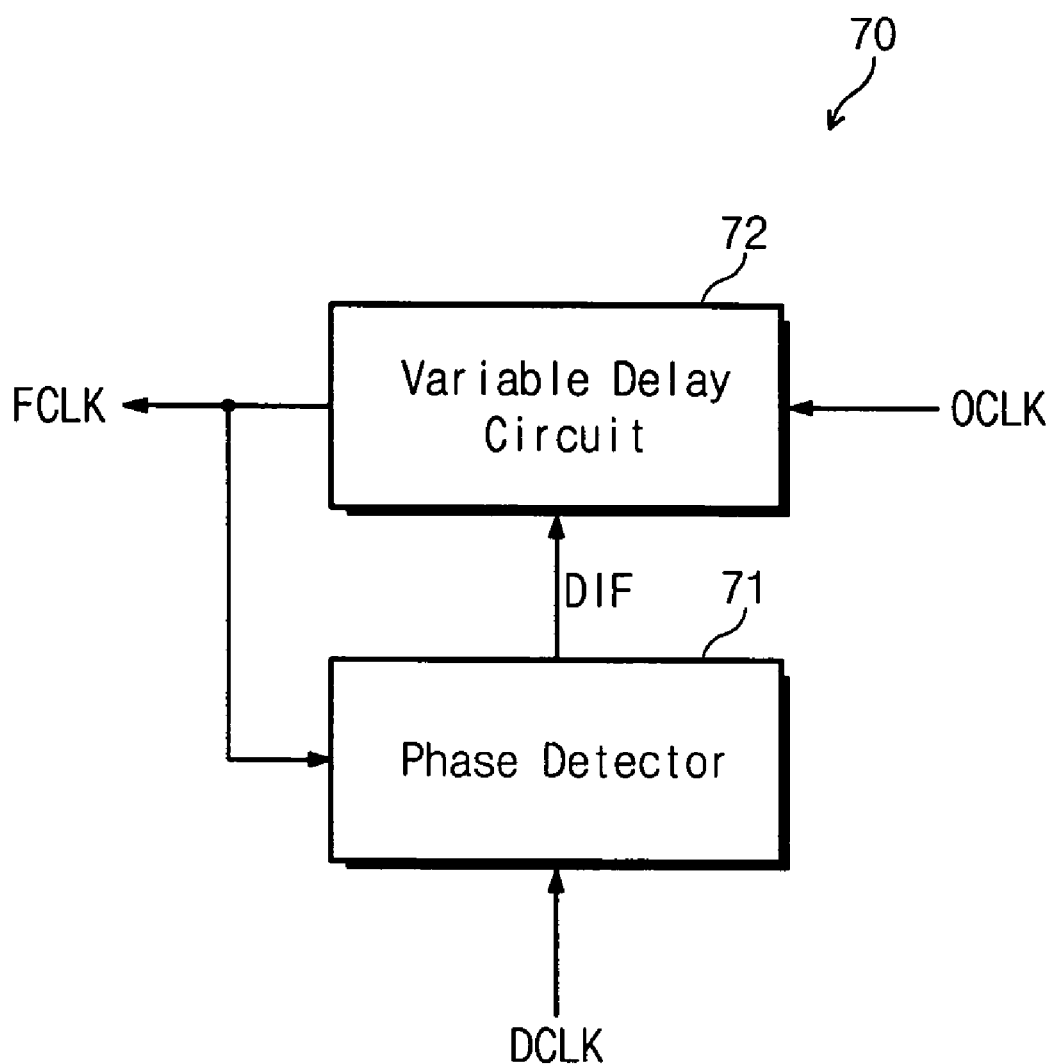
FIG. 2 illustrates a block diagram of an exemplary embodiment of a phase change circuit employable by the phase locked loop circuit of FIG. 1.

FIG. 2 illustrates a block diagram of an exemplary embodiment of the phase change circuit 70 employable by the phase locked loop circuit of FIG. 1. Referring to FIG. 2, the phase change circuit 70 may include a phase detector 71 and a variable delay circuit 72.

The phase detector 71 may detect a phase difference between a delay clock signal (DCLK) and a feedback clock signal (FCLK) and may generate a difference signal (DIF) corresponding to the first phase.

The variable delay circuit 72 may delay an output clock signal (OCLK) by the first phase in response to the difference signal (DIF) and may generate a feedback clock signal (FCLK) having a phase synchronized with a phase of an input clock signal (ICLK). The variable delay circuit 72 may be referred to as a voltage controlled delay line (VCDL).

In another exemplary embodiment of the phase change circuit 70, a charge pump circuit and a low pass filter may be disposed between the phase detector 71 and the variable delay circuit 72.

Figure 3:
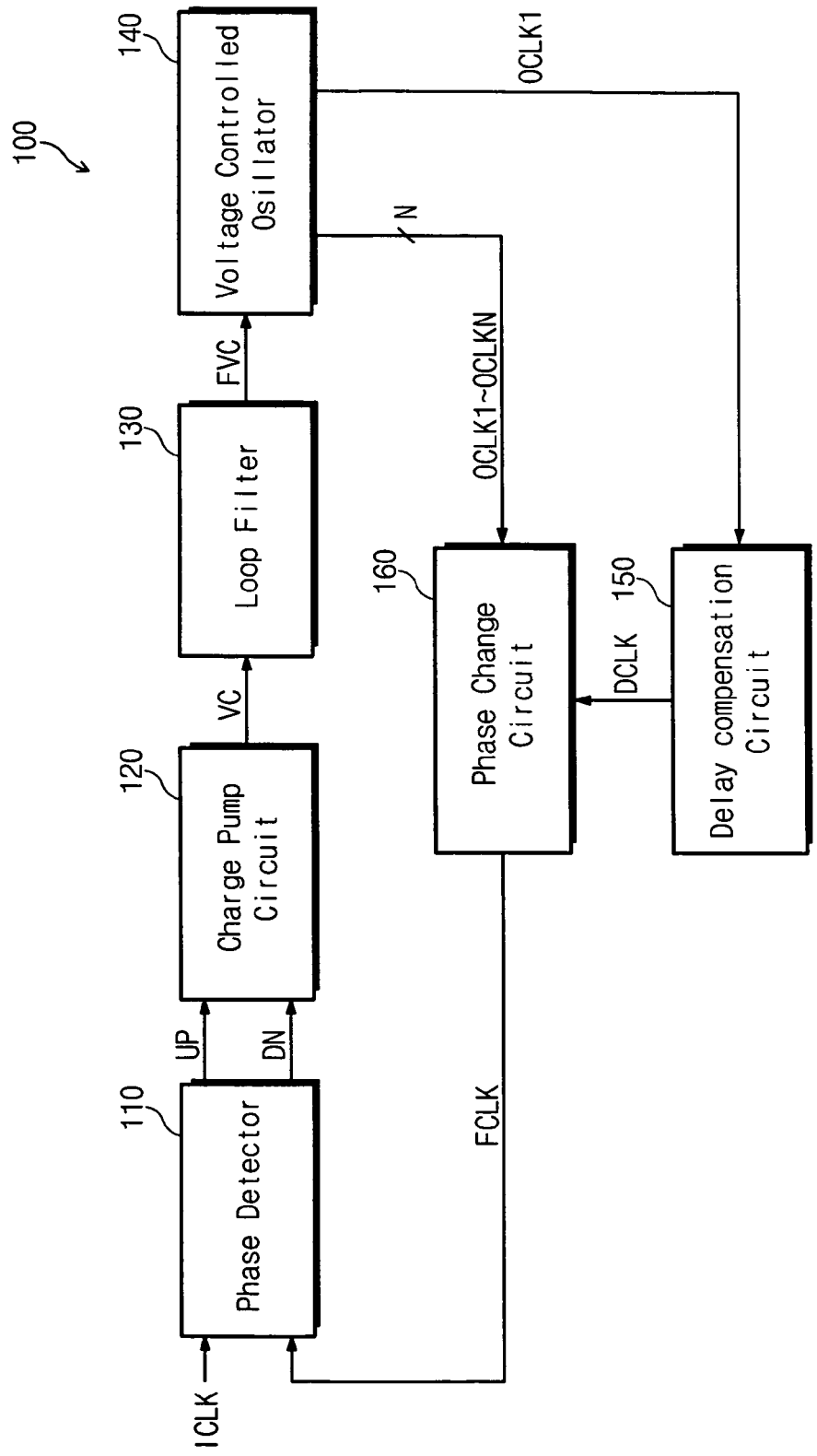
FIG. 3 illustrates a block diagram of a phase locked loop circuit according to another exemplary embodiment.

FIG. 3 illustrates a block diagram of a phase locked loop circuit 100 according to another exemplary embodiment.

Referring to FIG. 3, the phase locked loop circuit 100 may include a phase detector 110, a charge pump circuit 120, a loop filter 130, a voltage controlled oscillator 140, a delay compensation circuit 150 and a phase change circuit 160. The phase locked loop circuit 100 may generate a feedback clock signal (FCLK) having a phase synchronized with a phase of an input clock signal (ICLK).

Since structures and/or functions of the phase detector 110, the charge pump circuit 120 and the loop filter 130 may be similar to those of the phase detector 20, the charge pump circuit 30 and the loop filter 40 depicted in FIG. 1, a description of the structures and/or functions of the phase detector 110, the charge pump circuit 120 and the loop filter 130 will not be repeated.

The voltage controlled oscillator 140 may control frequencies of output clock signals first through Nth (OCLK1, OCLK2, OCLK3, . . . , OCLKN) in response to a control signal (FVC). The voltage controlled oscillator 140 may be embodied by a ring oscillator including an inverter.

The voltage controlled oscillator 140 may delay a first output signal (OCLK1) and a phase of the first output signal (OCLK1) by 360/N degrees respectively to generate a second output clock signal (OCLK2) having a phase of 360×1/N degrees through an Nth output clock signal (OCLKN) having a phase of 360×(N−1)/N degrees.

The output clock signals (OCLK1, OCLK2, OCLK3, . . . , OCLKN) may be multi-phase clock signals having the same frequency and different phases, respectively. The differences between the phases of the respective output clock signals (OCLK1, OCLK2, OCLK3, . . . , OCLKN) may be uniform. N may be an integer equal to 2 or more.

The first output clock signal (OCLK1) may correspond to the output clock signal (OCLK) of FIG. 1 and may have a phase leading a phase of the input clock signal (ICLK) by a first phase equivalent to a second phase corresponding to a delay compensation time in the delay compensation circuit 150. The first phase may be a phase corresponding to a remainder time that may result from diving the delay compensation time by a period of the input clock signal (ICLK) (or the feedback clock signal (FCLK)), where the quotient is an integer. The first phase may be relatively small compared with the second phase. The first phase may be a time corresponding to a difference between, e.g., subtraction, a time corresponding to an integer multiple of the period of the input clock signal (ICLK) (or the feedback clock signal (FCLK)) and the delay compensation time. The first phase may correspond to a time smaller than the period of the input clock signal (ICLK) (or the feedback clock signal (FCLK)).

The delay compensation time may be relatively large compared with a period of the input clock signal (ICLK). For example, the delay compensation time may be a data output time (tSAC) in a semiconductor memory device such as a double data rate (DDR) synchronous dynamic random access memory (SDRAM) or a graphic double data rate (GDDR) SDRAM. The data output time (tSAC) may correspond to a period of time that lapses from when a first output clock signal (OCLK1) is input to a data output buffer included in a semiconductor memory device to when data is output from the data output buffer. In a DDR SDRAM or a GDDR SDRAM, when a period of an input clock signal (ICLK) is, e.g., about 1 ns, the delay compensation time may be a time, e.g., between about 3 ns and about 5 ns.

More particularly, e.g., when N is 4, if a phase of a first output clock signal (OCLK1) is 0 degrees (or 360 degrees), a phase of a second output clock signal (OCLK2) may be 90 degrees, a phase of a third output clock signal (OCLK3) may be 180 degrees and a phase of a fourth output clock signal (OCLK4) may be 270 degrees.

The delay compensation circuit 150 may generate a delay clock signal (DCLK) by delaying a phase of a first output clock signal (OCLK1) by the second phase. When the delay compensation circuit 50 is employed with a semiconductor memory device, the delay compensation circuit 150 may be a replica circuit compensating for a delay time (tSAC) in a data output buffer included in the semiconductor memory device.

The phase change circuit 160 may perform a function similar to a digital delay locked loop circuit and may perform a function of a delay compensation circuit. Since the phase change circuit 160 may have a small feedback delay time, the phase change circuit 160 may have a relatively great bandwidth that may be employed to compensate for a change of a delay compensation time in the delay compensation circuit 150 according to a temperature in the delay compensation circuit 150.

The phase change circuit 160 may change a delay compensation time having the second phase to a first phase that may correspond to the second phase, e.g., may correspond to a remainder time that may result from dividing the delay compensation time by a period of the input clock signal (ICLK) (or the feedback clock signal (FCLK)), where the quotient is an integer. The first phase may correspond to a phase difference between the delay clock signal (DCLK) and the feedback clock signal (FCLK). The phase change circuit 160 may generate a feedback clock signal (FCLK) having a phase synchronized with a phase of the input clock signal (ICLK) using phases of at least two signals among the first through Nth output clock signals (OCLK1, OCLK2, OCLK3, . . . , OCLKN). Phases of at least two signals among the first through Nth output clock signals (OCLK1, OCLK2, OCLK3, . . . , OCLKN) may correspond to the first phase.

The phase change circuit 160 may change a second phase (e.g., 1080 degrees) corresponding to the delay compensation time to a first phase equivalent to the second phase. That is, e.g., the first phase may be a phase of less than 360 degrees corresponding to a period of the input clock signal (ICLK).

For example, when a period of an input clock signal (ICLK) is about 1 ns and a delay compensation time is about 3.3 ns, a delay time of a first output clock signal (OCLK1) in the phase change circuit 160 may be about 0.3 ns. That is, the phase change circuit 160 may delay a phase of a first output clock signal (OCLK1) by a phase corresponding to about 0.3 ns to generate a feedback clock signal (FCLK) having a phase synchronized with a phase of an input clock signal.

Thus, embodiments of the phase locked loop circuit 100 may perform a locking operation and/or synchronize a phase of a signal, e.g., a phase of a feedback clock signal (FCLK), with a phase of an input signal, e.g., a phase of an input clock signal (ICLK), in accordance with a delay compensation time having a second phase based on a first phase that may be smaller than, but equivalent to, the second phase. Embodiments may enable a feedback delay time, e.g., a delay time of the phase change circuit 160, of the phase locked loop 100 to be reduced.

In embodiments, by reducing a feedback delay time of the phase locked loop circuit 100, a bandwidth of the phase locked loop circuit 100 may be increased. By increasing a bandwidth of the phase locked loop circuit 100, e.g., stability of the phase locked loop circuit 100 may be improved, an output jitter of the phase locked loop circuit 100 may be reduced, and/or a size of a capacitor of the loop filter 130 may be reduced. More particularly, in embodiments, by increasing a bandwidth of, e.g., the phase locked loop circuit 100, even though a power supply noise may exist, e.g., in the delay compensation circuit 150 and/or the voltage controlled oscillator 140, an output jitter of the phase locked loop circuit 100 may be reduced. By reducing a size of a capacitor of the loop filter 130 included in the phase locked loop circuit 100, a size of an area of the phase locked loop circuit 100 may be reduced.

Since the phase locked loop circuit 100 has a feedback delay time, the phase locked loop circuit 100 may filter a jitter of an input clock signal (ICLK).

Figure 4:
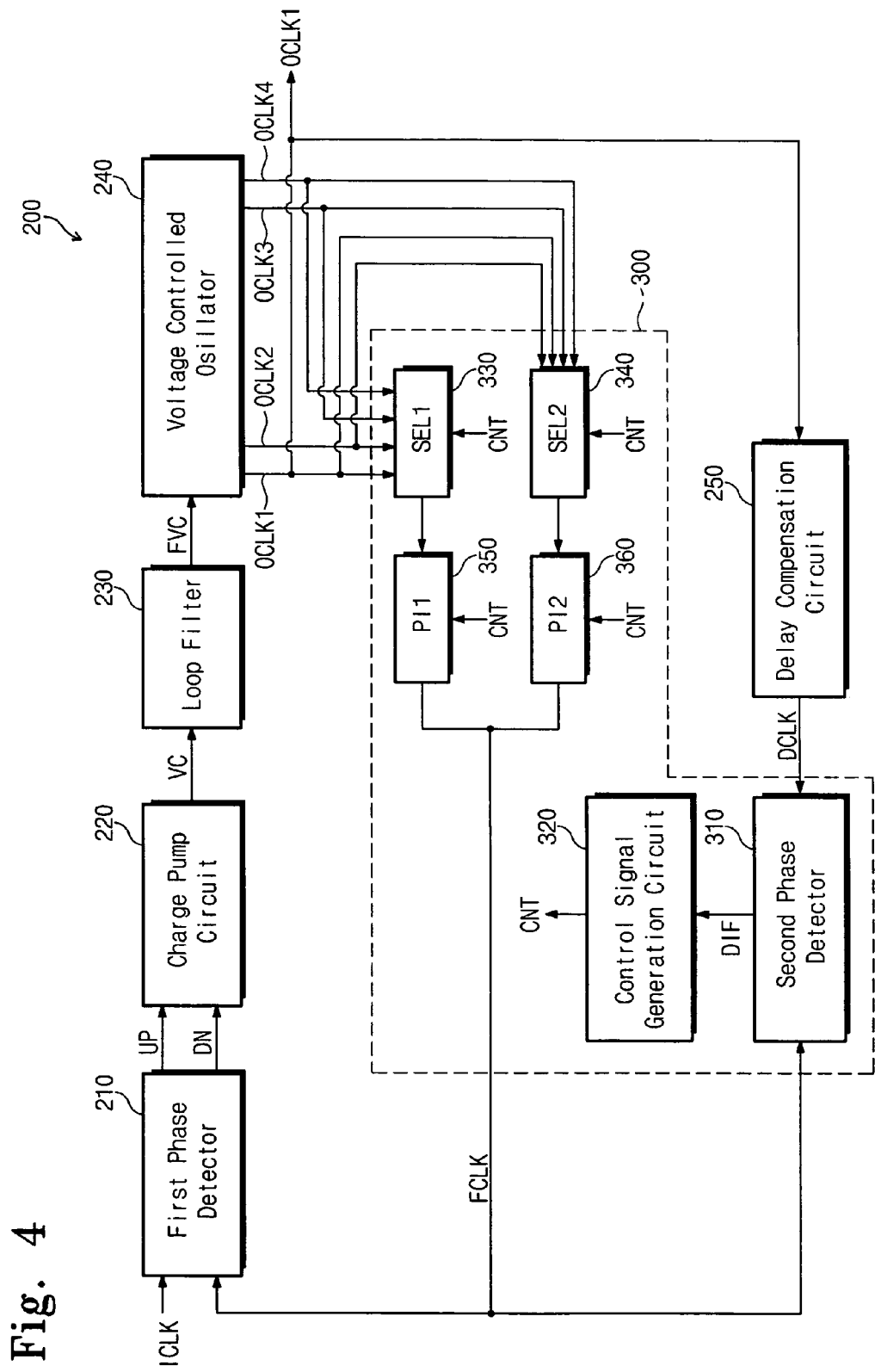
FIG. 4 illustrates a block diagram of a phase locked loop circuit according to another exemplary embodiment.

FIG. 4 illustrates a block diagram of a phase locked loop circuit 200 according to another exemplary embodiment.

Referring to FIG. 4, the phase locked loop circuit 200 may include a first phase detector 210, a charge pump circuit 220, a loop filter circuit 230, a voltage controlled oscillator 240, a delay compensation circuit 250, and a phase change circuit 300.

Since structures and/or functions of the first phase detector 210, the charge pump circuit 220, the loop filter circuit 230 may be similar to the those of the phase detector 20, the charge pump circuit 30 and the loop filter 40 depicted in FIG. 1, a description of the structures and/or functions of the first phase detector 210, the charge pump circuit 220, the loop filter circuit 230 will not be repeated.

The voltage controlled oscillator 240 may control frequencies of multiple output clock signals, e.g., first through fourth output clock signals (OCLK1, OCLK2, OCLK3, OLCK4), in response to a control signal (FVC). The output clock signals (OCLK1, OCLK2, OCLK3, OLCK4) may correspond to four output clock signals generated from the voltage controlled oscillator 140 depicted in FIG. 3 and may correspond to a case of when N of the voltage controlled oscillator 140 of FIG. 3 is equal to 4.

More particularly, e.g., the voltage controlled oscillator 240 may generate a first clock signal (OCLK1) having a phase of 0 degrees (or 360 degrees), a second clock signal (OCLK2) having a phase lagging behind the phase of the first clock signal (OCLK1) by 360×1/4 degrees (90 degrees), a third clock signal (OCLK3) having a phase lagging behind the phase of the first clock signal (OCLK1) by 360×2/4 degrees (180 degrees) and a fourth clock signal (OCLK4) having a phase lagging behind the phase of the first clock signal (OCLK1) by 360×3/4 degrees (270 degrees).

The first output clock signal (OCLK1) may correspond to the output clock signal (OCLK) of FIG. 1 and may have a phase leading a phase of an input clock signal (ICLK) by a first phase equivalent to a second phase corresponding to a delay compensation time in the delay compensation circuit 250. The first phase may be a phase corresponding to a remainder time that may result from dividing the delay compensation time by a period of the input clock signal (ICLK) (or the feedback clock signal (FCLK)), where the quotient is an integer. The first phase may be relatively small compared with the second phase. The first phase may be a time corresponding to a difference between, e.g., subtraction, a time corresponding to an integer multiple of the period of the input clock signal (ICLK) (or the feedback clock signal (FCLK)) and the delay compensation time. The first phase may correspond to a time smaller than the period of the input clock signal (ICLK) (or the feedback clock signal (FCLK)).

The delay compensation time may be relatively large compared with a period of the input clock signal (ICLK). For example, the delay compensation time may be a data output time (tSAC) in a semiconductor memory device such as a double data rate (DDR) synchronous dynamic random access memory (SDRAM) or a graphic double data rate (GDDR) SDRAM. The data output time (tSAC) may correspond to a period of time that lapses from when a first output clock signal (OCLK1) is input to a data output buffer included in a semiconductor memory device to when data is output from the data output buffer. In a DDR SDRAM or a GDDR SDRAM, when a period of an input clock signal (ICLK) is, e.g., about 1 ns, the delay compensation time may be a time, e.g., between about 3 ns and about 5 ns.

The delay compensation circuit 250 may generate a delay clock signal (DCLK) by delaying a phase of a first output clock signal (OCLK1) by the second phase corresponding to the delay compensation time. When the delay compensation circuit 250 is employed with a semiconductor memory device, the delay compensation circuit 60 may be a replica circuit compensating for a delay time (tSAC) in a data output buffer included in the semiconductor memory device.

The phase change circuit 300 may perform a function similar to a digital delay locked loop circuit and may perform a function of a delay compensation circuit. Since the phase change circuit 300 may have a small feedback delay time, the phase change circuit 300 may have a relatively great bandwidth that may be employed to compensate for a change of a delay compensation time in the delay compensation circuit 250 according to a temperature in the delay compensation circuit 250.

The phase change circuit 300 may change a delay compensation time having the second phase to a first phase that may correspond to the second phase, e.g., may correspond to a remainder time that may result from dividing the delay compensation time by a period of the input clock signal (ICLK) (or the feedback clock signal (FCLK)), where the quotient is an integer. The first phase may correspond to a phase difference between the delay clock signal (DCLK) and the feedback clock signal (FCLK).

The phase change circuit 300 may generate a feedback clock signal (FCLK) having a phase synchronized with a phase of the input clock signal (ICLK) using phases of at least two signals among the output clock signals (OCLK1, OCLK2, OCLK3, OLCK4). Phases of two signals among the output clock signals (OCLK1, OCLK2, OCLK3, OLCK4) may correspond to the first phase.

The phase change circuit 300 may change a second phase (e.g., 1080 degrees) corresponding to the delay compensation time to a first phase equivalent to the second phase, e.g., phase of the delay compensation time. That is, e.g., the first phase may be phase of less than 360 degrees corresponding to a period of an input clock signal (ICLK).

The phase change circuit 300 may include a second phase detector 310, a control signal generation circuit 320, a first select circuit (SEL1) 330, a second select circuit (SEL2) 340, a first phase interpolator (PI1) and a second phase interpolator (PI2) 360.

A circuit including the first select circuit (SEL1) 330, the second select circuit (SEL2) 340, the first phase interpolator (PI1), and the second phase interpolator (PI2) 360 may perform a function of a phase rotator.

The second phase detector 310 may detect a phase difference between a delay clock signal (DCLK) and a feedback clock signal (FCLK) to generate a difference signal (DIF) corresponding to the first phase.

The control signal generation circuit 320 may generate a digital control signal (CNT) in response to the difference signal (DIF). The digital control signal (CNT) may include a large number of bits. For example, upper bits of the digital control signal (CNT) may control the first and second select circuits 330 and 340 and lower bits of the digital control signal (CNT) may control the first and second interpolators 350 and 360. The control signal generation circuit 320 may include a counter.

The first select circuit 330 may select one among the first through fourth output clock signals (OCLK1, OCLK2, OCLK3, OCLK4) in response to the digital control signal (CNT). The first select circuit 330 may be embodied by a multiplexer, e.g., a 4:1 mux.

The second select circuit 340 may select one among the first through fourth output clock signals (OCLK1, OCLK2, OCLK3, OCLK4) in response to the digital control signal (CNT), and a phase of the selected one may be greater than and adjacent to a phase of the output clock signal selected by the first select circuit 330. For example, when an output clock signal selected by the first select circuit 330 is the first output clock signal (OCLK1), an output clock signal selected by the second select circuit 340 may be the second output clock signal (OCLK2). When an output clock signal selected by the first select circuit 330 is the fourth output clock signal (OCLK4), an output clock signal selected by the second select circuit 340 may be the first output clock signal (OCLK1) having a phase of 0 degrees (or 360 degrees). Operations of the first select circuit 330 and the second select circuit 340 may be performed at the same time. The second select circuit 340 may be embodied by a multiplexer, e.g., a 4:1 mux.

The first phase interpolator 350 may finely control a phase of an output clock signal selected by the first select circuit 330 in response to the digital control signal (CNT), and may output the output clock signal. The second phase interpolator 360 finely controls a phase of an output clock signal selected by the second select circuit 340 in response to the digital control signal (CNT), and may output the output clock signal. A signal corresponding to a combination, e.g., addition, of the output signal of the first phase interpolator 350 and the output signal of the second phase interpolator 360 may be a feedback clock signal (FCLK). Operations of the first and second phase interpolators 350 and 360 may be performed at the same time.

For example, when a delay compensation time is 5 ns, a delay time consumed in the first and second select circuits 330 and 340 and the first and second phase interpolators 350 and 360 may be 500 ps relatively shorter than 5 ns. Thus, the phase locked loop circuit 200 has a relatively short feedback delay time.

When a period of an input clock signal (ICLK) is, e.g., about 1 ns and a delay compensation time is about 3.3 ns corresponding to the second phase, an operation of the phase change circuit 300 may be as follows.

The second phase detector 310 may generate a difference signal (DIF) indicating a first phase of about (0.3/1)×360 degrees, i.e., about 120 degrees, corresponding to about 0.3 ns which is a phase difference between a phase of the feedback corresponding to about 1 ns and a phase of the delay clock signal (DCLK) corresponding to about 3.3 ns.

The control signal generation circuit 320 may generate a digital control signal (CNT) corresponding to the difference signal (DIF). The first select circuit 330 may select a second output clock signal (OCLK2) having a phase of 90 degrees in response to the digital control signal (CNT) and may output the second clock signal (OCLK2). The second select circuit 340 may select a third output clock signal (OCLK3) having a phase of 180 degrees, e.g., greater than 90 degrees, and adjacent to the second output clock signal (OCLK2) in response to the digital control signal (CNT), and may output it. The second and third output clock signals (OCLK2, OCLK3) may be signals corresponding to 120 degrees.

The first phase interpolator 350 may control a phase of 90 degrees of the second output clock signal (OCLK2) so as to turn toward 120 degrees in response to the digital control signal, and may output it. The second phase interpolator 360 may control a phase of 180 degrees of the third output clock signal (OCLK3) so as to turn toward 120 degrees in response to the digital control signal, and may output it. A signal corresponding to a combination, e.g., addition, of the output signal of the first phase interpolator 350 and the output signal of the second phase interpolator 360, may be a feedback clock signal (FCLK) having a phase lagging behind a phase of the first output clock signal (OCLK1) by 120 degrees. As a result, a phase of the feedback clock signal (FCLK) may be synchronized with a phase of an input clock signal (ICLK), and the feedback clock signal (FCLK) may reflect a delay compensation time of the delay compensation circuit 250.

Thus, embodiments of the phase locked loop circuit 200 may perform a locking operation and/or synchronize a phase of a signal, e.g., a phase of a feedback clock signal (FCLK), with a phase of an input signal, e.g., a phase of an input clock signal (ICLK), in accordance with a delay compensation time having a second phase based on a first phase that may be smaller than, but equivalent to, the second phase. Embodiments may enable a feedback delay time, e.g., a delay time in the phase change circuit 300, of the phase locked loop circuit 200 to be reduced.

In embodiments, by reducing a feedback delay time of the phase locked loop circuit 200, a bandwidth of the phase locked look circuit 200 may be increased. By increasing a bandwidth of the phase locked loop circuit 200, e.g., stability of the phase locked loop circuit 200 may be improved, an output jitter of the phase locked loop circuit 200 may be reduced, and/or a size of a capacitor of the loop filter 230 may be reduced. More particularly, in embodiments, by increasing a bandwidth of, e.g., the phase locked loop circuit 200, event though a power supply noise may exist, e.g., in the delay compensation circuit 250 and/or the voltage controlled oscillator 240, an output jitter of the phase locked loop circuit 200 may be reduced. By reducing a size of a capacitor in the loop filter 230 included in the phase locked loop circuit 200, a size of an area of the phase locked loop circuit 200 may be reduced.

Since the phase locked loop filter 200 has a feedback delay time, the phase locked loop filter 200 may filter a jitter of an input clock signal (ICLK) and/or may filter a dithering jitter that may be generated by the phase interpolators 350 and 360.

Figure 5:
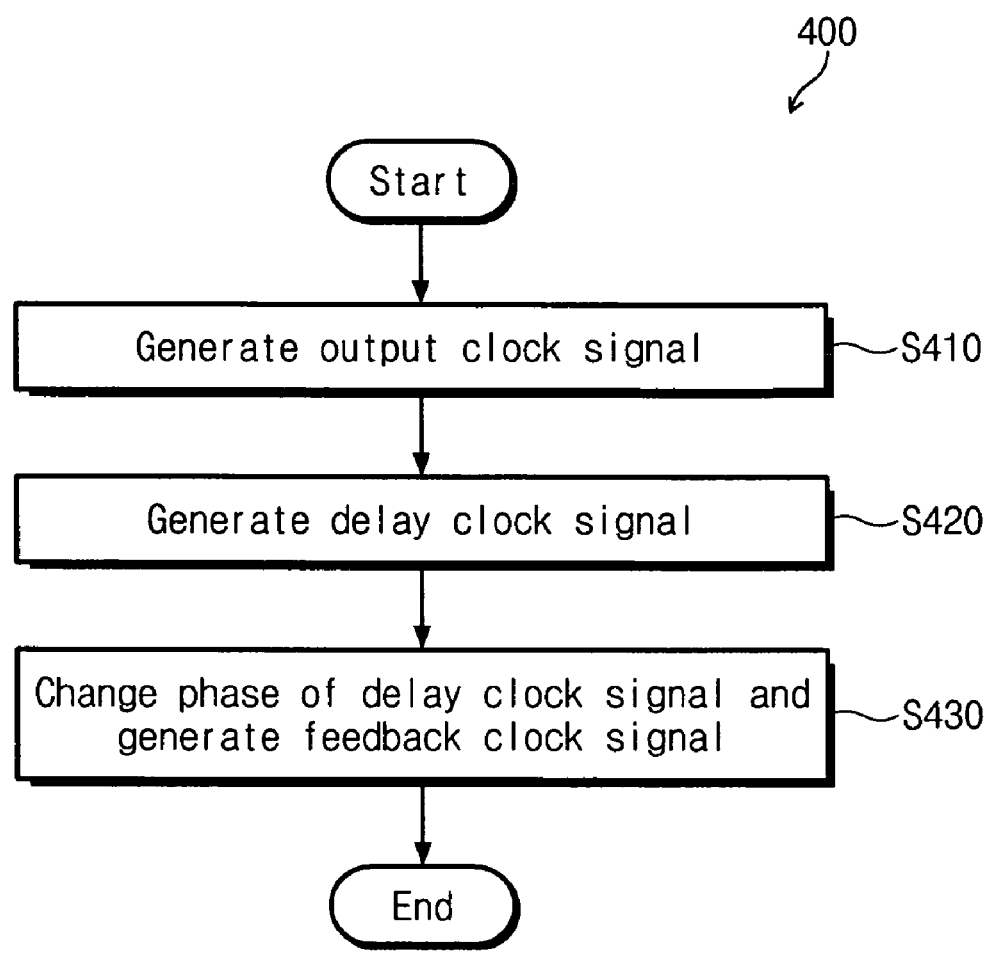
FIG. 5 illustrates a flow chart of an exemplary embodiment of a method of operating a phase locked loop circuit.

FIG. 5 illustrates a flow chart of an exemplary embodiment of a method 400 of operating a phase locked loop circuit.

The method 400 of operating a phase locked loop circuit depicted in FIG. 5 may be applied, e.g., to the phase locked loop circuit 10 depicted in FIG. 1, the phase locked loop circuit 100 depicted in FIG. 3 and/or the phase locked loop circuit 200 depicted in FIG. 4.

Referring to FIG. 5, the method 400 of operating a phase locked loop circuit may include generating an output clock signal S410, generating a delay clock signal S420, and performing a phase change S430.

With regard to the exemplary embodiment of FIG. 1, for generating an output clock signal S410, the voltage controlled oscillator 50 of FIG. 1 may generate an output clock signal (OCLK) having a phase leading an input clock signal (ICLK) by a first phase.

With regard to the exemplary embodiment of FIG. 3, for generating an output clock signal S410, the voltage controlled oscillator 140 of FIG. 3 may generate a first output clock signal (OCLK1) having a phase leading the input output clock signal (ICLK) and corresponding to the output clock signal (OCLK), a second output clock signal (OCLK2) having a phase of 360×1/N degrees through an Nth output clock signal (OCLKN) having a phase of 360×(N−1)/N degrees by delaying the phase of the first output clock signal (OCLK1) by 360/N degrees, respectively.

In embodiments, N may be a natural number of 2 or more, and may be a number such that 360/N may be a natural number. The output clock signals (OCLK1, OCLK2, OCLK3, . . . , OCLKN) may be multi-phase clock signals. The first phase may be equivalent to a second phase corresponding to a delay compensation time in, e.g., the delay compensation circuit 60 of FIG. 1 or the delay compensation circuit 150, 250 of FIGS. 3 and 4, respectively. The first phase may correspond to a remainder time that may result from dividing the respective delay compensation time by a period of the input clock signal (ICLK) (or the feedback clock signal (FCLK)), where the quotient is an integer. The first phase is relatively small compared with the second phase.

The delay compensation time may be a time relatively large compared with a period of the input clock signal (ICLK). For example, the delay compensation time may be a data output time (tSAC) in a semiconductor memory device such as a double data rate (DDR) synchronous dynamic random access memory (SDRAM) or a graphic double data rate (GDDR) SDRAM. The data output time (tSAC) may correspond to a period of time that lapses from when, e.g., a first output clock signal (OCLK, OCLK1) is input to a data output buffer included in a semiconductor memory device to when data is output from the data output buffer.

For generating a delay clock signal S420, the delay compensation circuit 60, 150, 250 may generate a delay clock signal (DCLK) by delaying a phase of the first output clock signal (OCLK, OCLK1) by a second phase corresponding to the respective delay compensation time.

With regard to the exemplary phase locked loop circuit 10 of FIG. 1, e.g., for performing a phase change S430, the phase change circuit 70 may change the second phase to the first phase and generates a feedback clock signal (FCLK) having a phase synchronized with a phase of the input clock signal (ICLK) using the first phase. The first phase corresponds to a phase difference between the delay clock signal (DCLK) and the feedback clock signal (FCLK).

More particularly, e.g., for performing the phase change S430, the phase detector 71 of FIG. 2 may generate a difference signal (DIF) corresponding to the first phase by detecting a phase difference between the delay clock signal (DCLK) and the feedback clock signal (FCLK). The variable delay circuit 72 of FIG. 2 may generate a feedback clock signal (FCLK) having a phase synchronized with a phase of the input clock signal (ICLK) by delaying the first phase in response to the difference signal (DIF).

With regard to the exemplary phase locked loop circuit 100 of FIG. 3, e.g., for performing the phase change 430, the phase change circuit 160 of FIG. 3 may generate a feedback clock signal (FCLK) having a phase synchronized with a phase of the input clock signal (ICLK) using at least two signals among first through Nth output clock signals (OCLK1, OCLK2, OCLK3, . . . , OCLKN) corresponding to the first phase.

Figure 6:
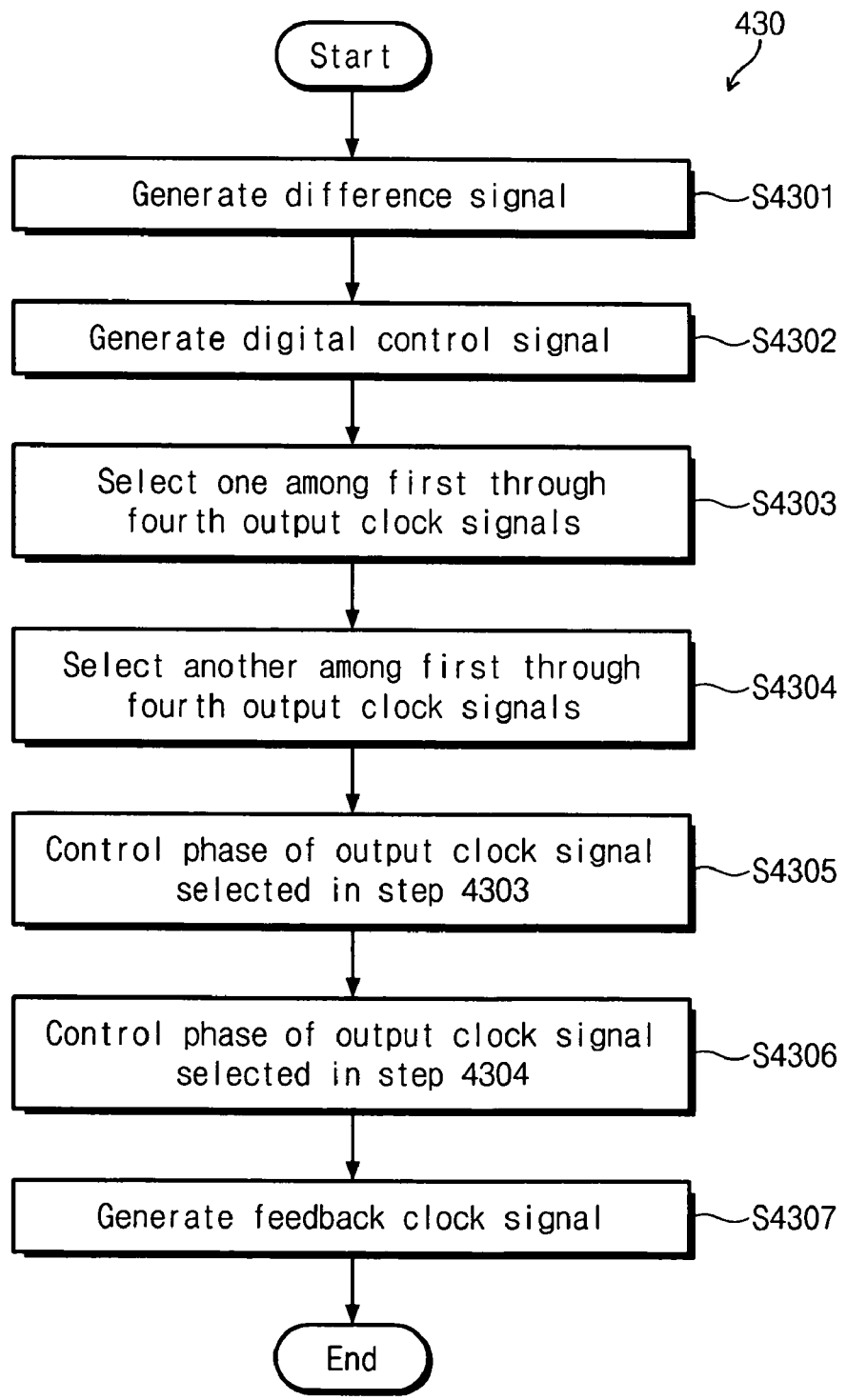
FIG. 6 illustrates a flow chart of a phase change process according to an exemplary embodiment when N is 4.

With regard to the exemplary phase locked loop circuit 200 of FIG. 4, e.g., FIG. 6 illustrates a flow chart for performing a phase change S430 according to an exemplary embodiment when N is 4.

Referring to FIG. 6, performing a phase change S430 may include generating a difference signal S4301, generating a digital control signal S4302, performing a first selection S4303, performing a second selection S4304, controlling a first phase S4305, controlling a second phase S4306 and generating a feedback clock signal S4307.

For generating a difference signal S4301, the second phase detector 310 may generate a difference signal (DIF) corresponding to the first phase by detecting a phase difference between the delay clock signal (DCLK) and the feedback clock signal (FCLK).

For generating a digital control signal S4302, the control signal generation circuit 320 may generate a digital control signal (CNT) in response to the difference signal (DIF). The digital control signal (CNT) may include a large number of bits. For example, upper bits of the digital control signal (CNT) may control the first and second select circuits 330 and 340 and lower bits of the digital control signal (CNT) may control the first and second interpolators 350 and 360.

For performing the first select selection S4303, the first select circuit 330 may select one among the first through fourth output clock signals (OCLK1, OCLK2, OCLK3, OCLK4) in response to the digital control signal (CNT).

For performing the second selection S4304, the second select circuit 340 may select another one among the first through fourth output clock signals (OCLK1, OCLK2, OCLK3, OCLK4) in response to the digital control signal (CNT), where a phase of the selected another one may be greater than and adjacent to a phase of the output clock signal selected in while performing the first selection S4303.

For controlling the first phase S4305, the first phase interpolator 350 may finely control a phase of an output clock signal selected while performing the first selection S4303 in response to the digital control signal (CNT), and may output the output clock signal. For controlling the second phase S4306, the second phase interpolator 360 may finely control a phase of an output clock signal selected while performing the second selection S4304 in response to the digital control signal (CNT), and may output the output clock signal.

For generating a feedback clock signal S4307, the output clock signal resulting from controlling the first phase S4305 and the output clock signal resulting from controlling the second phase S4306 may be added to generate a feedback clock signal (FCLK) having a phase synchronized with a phase of the input clock signal (ICLK).

The exemplary method 400 of operating a phase locked loop circuit may perform a locking operation and/or synchronize a phase of a signal, e.g., a phase of a feedback clock signal (FCLK), with a phase of an input signal, e.g., a phase of an input clock signal (ICLK), in accordance with a delay compensation time having a second phase based on a first phase that may be smaller than, but equivalent to, the second phase. Embodiments may enable a feedback delay time, e.g., a delay time of the phase change circuit, e.g., the phase change circuit 70, 160, 300 of the phase locked loop 10, 100, 200, to be reduced.

Since a feedback delay time of the phase locked loop circuit, e.g., 10, 100, 200, may be reduced, the exemplary method 400 of operating a phase locked loop circuit may increase a bandwidth and a stability of the phase locked loop circuit, e.g., 10, 100, 200. More particularly, by increasing a bandwidth of, e.g., the phase locked loop circuit, e.g., 10, 100, 200, the exemplary method 400 of operating a phase locked loop circuit may improved stability of the phase locked loop circuit 10, 100, 200, may reduce an output jitter of the phase locked loop circuit 10, 100, 200, and/or may enable a size the phase locked loop circuit 10, 100, 200 to be reduced. More particularly, a size of the phase locked loop circuit 10, 100, 200 may be reduced by enabling a smaller capacitor to be employed in a loop filter 40, 130, 230 of the phase locked loop circuit 10, 100, 200.

Figure 7:
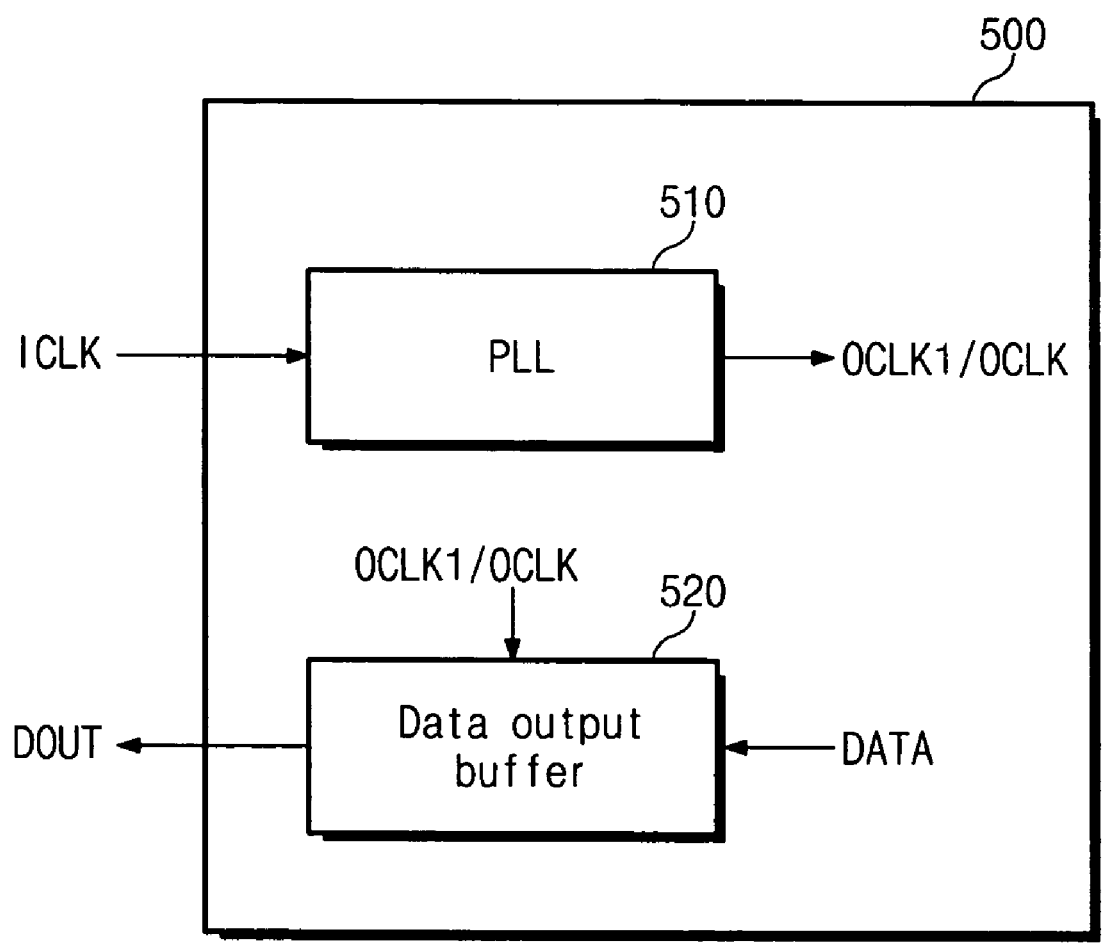
FIG. 7 illustrates a block diagram of a semiconductor memory device according to an exemplary embodiment.

FIG. 7 illustrates a block diagram of a semiconductor memory device 500 according to an exemplary embodiment.

Referring to FIG. 7, the semiconductor memory device 500 may include a phase locked loop circuit (PLL) 510 and a data output buffer 520. The semiconductor memory device 500 may, e.g., be a DDR SDRAM or a GDDR SDRAM.

The phase locked loop circuit 510 may be, e.g., the phase locked loop circuit 10 depicted in FIG. 1, the phase locked loop circuit 100 depicted in FIG. 3 or the phase locked loop circuit 200 depicted in FIG. 4.

The phase locked loop circuit 510 may generate a first output clock signal (OCLK for the phase locked loop circuit 100, OCLK1 for the phase locked loop circuits 100, 200). The first output clock signal (OCLK, OCLK1) may have a first phase leading a phase of an input clock signal (ICLK) by a phase corresponding to a data output time (tSAC). The data output time (tSAC) may correspond to a period of time that lapses from when, e.g., a first output clock signal (OCLK, OCLK1) is input to a data output buffer included in a semiconductor memory device to when data is output from the data output buffer. The data output time (tSAC) may be greater than a period of the input clock signal (ICLK).

The data output buffer 520 may output an internal output data as an output data (DOUT) in response to the first output clock signal (OCLK, OCLK1). The output data (DOUT) may be output as being synchronized with the input clock signal (ICLK) and may be provided to an external device, e.g., a memory controller. The internal output data (DATA) may be output from a memory cell array (not shown) included in the semiconductor memory device 500.

Semiconductor devices, e.g., embodiments of the semiconductor memory device 500, include a phase locked loop circuit, e.g., a phase locked look circuit 510, having one or more of the features described above with regard to the phase locked look circuit 10, 100, 200, may be advantageous by having, e.g., a reduced output jitter and/or a reduced circuit area. More particularly, e.g., the semiconductor device 500 may output the output data (DOUT) synchronized with the input clock signal (ICLK) and may have a reduced chip area.

When a bandwidth of the phase locked loop circuit 510 becomes equal to a bandwidth of the phase change circuit (70 of FIG. 1, 160 of FIG. 3 and 300 of FIG. 4), which may be included in the phase locked loop circuit 510, and performs a function of a delay locked loop circuit by a temperature change of the semiconductor memory device 500, the phase locked loop circuit 510 may become unstable. To reduce and/or prevent such instability, when the semiconductor memory device 500 performs a refresh operation, the phase change circuit (70 of FIG. 1, 160 of FIG. 3 and 300 of FIG. 4) may be turned on and when the semiconductor memory device 500 performs a normal operation such as a data read operation, the phase change circuit may become turned off. For example, an on/off operation of the phase change circuit (70 of FIG. 1, 160 of FIG. 3 and 300 of FIG. 4) may be performed by arranging a switch responding to an on/off control signal between the delay clock signal (DCLK) and the feedback clock signal (FCLK), i.e., signals of the phase locked loop circuit (10 of FIG. 1, 100 of FIG. 3 and 200 of FIG. 4).

Embodiments of phase locked loop circuits, e.g., 10, 100, 200, and/or methods, e.g., 400, of operating a phase locked loop circuit including one or more of the features described above, may perform a lock operation and/or synchronize a phase of a signal, e.g., a phase of a feedback clock signal (FCLK), with a phase of an input signal, e.g., a phase of an input clock (ICLK), in accordance with a delay compensation time having a second phase based on the first phase that may be smaller than, but equivalent to, the second phase. Embodiments may enable a feedback delay time, e.g., a delay time of the phase change circuit 70, 160, 300, of the phase locked loop circuit, e.g., 10, 100, 200, to be reduced.

In embodiments, by reducing a feedback delay time of the phase locked loop circuit, e.g., 10, 100, 200, a bandwidth of the phase locked loop circuit 10, 100, 200 may be increased. By increasing a bandwidth of the phase locked loop circuit, e.g., 10, 100, 200, e.g., stability of the phase locked loop circuit 10, 100, 200 may be improved, an output jitter of the phase locked loop circuit 10, 100, 200 may be reduced, and/or a size the phase locked loop circuit 10, 100, 200 may be reduced. For example, a size of the phase locked loop circuit, e.g., 10, 100, 200, may be reduced by reducing a size of a capacitor of the loop filter 40, 130, 230 may be reduced. More particularly, in embodiments, by increasing a bandwidth of, e.g., the phase locked loop circuit 10,100, 200 even though a power supply noise may exist, e.g., in the delay compensation circuit 60, 150, 250 and/or the voltage controlled oscillator 50, 140, 240 an output jitter of the phase locked loop circuit 10, 100, 200 may be reduced. By reducing a size of a capacitor of the loop filter 40, 130, 230 included in the phase locked loop circuit 10, 100, 200 a size of an area of the phase locked loop circuit 10, 100, 200 may be reduced.

Embodiments of a semiconductor memory device including a phase locked loop circuit having one or more features described above, e.g., phase locked loop circuit 10, 100, 200, may be advantageous by having a reduced output jitter, a reduced circuit area, and/or a reduced chip area, and it may output the output data (DOUT) synchronized with the input clock signal (ICLK).

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A phase locked loop circuit, comprising:
   a delay compensation circuit adapted to generate a delay clock signal by delaying a phase of a first output clock signal by a second phase, the phase of the first output clock signal having a phase leading a phase of an input clock signal by a first phase, and the second phase corresponding to a delay compensation time greater than a period of the input clock signal and greater than the first phase; and
   a phase change circuit adapted to change the second phase to the first phase and to generate a feedback clock signal having a phase synchronized with the phase of the input clock signal in response to the first phase,
   wherein the phase change circuit includes:
      a phase detector adapted to detect a phase difference between the delay clock signal and the feedback clock signal and to generate a difference signal corresponding to the first phase; and
      a variable delay circuit adapted to delay the first output clock signal by the first phase in response to the difference signal to generate a feedback clock signal having a phase synchronized with the phase of the input clock signal,
   wherein the first phase is a phase corresponding to a remainder time resulting from the delay compensation time being divided by the period of the input clock, the quotient being an integer.

2. The phase locked loop circuit as claimed in claim 1, further comprising a charge pump circuit and a low pass filter disposed between the phase detector and the variable delay circuit.

3. The phase locked loop circuit as claimed in claim 1, further comprising a voltage controlled oscillator adapted to generate multiphase output clock signals including the first output clock signal, wherein:

the phase change circuit is adapted to generate a feedback clock signal having a phase synchronized with the phase of the input clock signal in response to the multiphase output clock signals corresponding to the first phase, and the multiphase output clock signals include a second output clock signal having a phase of 360×1/N degrees through Nth output clock signal having 360×(N−1)/N degrees by delaying the first output clock signal and a phase of the first output clock signal by 360/N degrees, respectively, where N is a natural number of 2 or more.

4. The phase locked loop circuit as claimed in claim 3, wherein, when the N is 4, the voltage controlled oscillator is adapted to generate the first output clock signal, a second output clock signal having a phase lagging behind the phase of the first output clock signal by 90 degrees, a third output clock signal having a phase lagging behind the phase of the first output clock signal by 180 degrees, and a fourth output clock signal having a phase lagging behind the phase of the first output clock signal by 270 degrees.

5. The phase locked loop circuit as claimed in claim 4, wherein the phase change circuit includes:

a control signal generation circuit adapted to generate a digital control signal in response to the difference signal;

a first select circuit adapted to select one among the first through fourth output clock signals in response to the digital control signal;

a second select circuit adapted to select another one among the first through fourth output clock signals in response to the digital control signal, the another one having a phase greater than and adjacent to a phase of the output clock signal selected by the first select circuit;

a first phase interpolator adapted to control a phase of the output clock signal selected by the first select circuit, and output the output clock signal in response to the digital control signal; and a second phase interpolator adapted to control a phase of the output clock signal selected by the second select circuit, and output the output clock signal in response to the digital control signal, wherein the output signal of the first phase interpolator is added to the output signal of the second phase interpolator to generate the feedback clock signal.

6. The phase locked loop circuit as claimed in claim 5, wherein a circuit including the first and second select circuits and the first and second phase interpolators is a phase rotator.

7. The phase locked loop circuit as claimed in claim 1, wherein the first phase is relatively small as compared to the second phase.

8. The phase locked loop circuit as claimed in claim 1, wherein the delay compensation time corresponds to a data output time of a semiconductor memory device.

9. The phase locked loop circuit as claimed in claim 8, wherein the semiconductor memory device is a double data rate (DDR) synchronous dynamic random access memory (SDRAM) and/or a graphic double rate (GDDR) SDRAM.

10. The phase locked loop circuit as claimed in claim 1, wherein the phase change circuit is adapted to compensate for a change in the delay compensation time of the delay compensation circuit as a result of temperature.

* * * * *